United States Patent
Li et al.

(10) Patent No.: US 12,490,521 B2
(45) Date of Patent: *Dec. 2, 2025

(54) ELECTRONIC DEVICE

(71) Applicant: Innolux Corporation, Miao-Li County (TW)

(72) Inventors: Dong-Lin Li, Tainan (TW); May Pan, Tainan (TW); Lavender Cheng, Tainan (TW)

(73) Assignee: Innolux Corporation, Miao-Li County (TW)

( * ) Notice: Subject to any disclaimer, the term of this patent is extended or adjusted under 35 U.S.C. 154(b) by 168 days.

This patent is subject to a terminal disclaimer.

(21) Appl. No.: 18/462,795

(22) Filed: Sep. 7, 2023

(65) Prior Publication Data

US 2023/0420450 A1 Dec. 28, 2023

Related U.S. Application Data

(63) Continuation of application No. 17/155,247, filed on Jan. 22, 2021, now Pat. No. 11,784,182.

(51) Int. Cl.
*H10D 89/60* (2025.01)
*H10D 86/40* (2025.01)

(52) U.S. Cl.
CPC ......... *H10D 89/931* (2025.01); *H10D 86/421* (2025.01); *H10D 86/441* (2025.01); *H10D 86/471* (2025.01); *H10D 89/811* (2025.01)

(58) Field of Classification Search
CPC .. H10D 86/471; H10D 86/421; H10D 86/441; H10D 89/811; H10D 89/931
See application file for complete search history.

(56) References Cited

U.S. PATENT DOCUMENTS

| 11,784,182 B2 * | 10/2023 | Li | H10D 89/931 |
| | | | 257/72 |
| 2015/0205176 A1 * | 7/2015 | Lu | G02F 1/136209 |
| | | | 349/44 |
| 2020/0363670 A1 * | 11/2020 | Shiina | G02F 1/1368 |
| 2021/0098496 A1 * | 4/2021 | Yu | H10D 86/441 |

* cited by examiner

*Primary Examiner* — Peter M Albrecht
(74) *Attorney, Agent, or Firm* — Patterson + Sheridan, LLP

(57) ABSTRACT

An electronic device is provided. The electronic device includes a substrate, first, second, and third wires, first and second semiconductor elements, and a conductor. The first, second, and third wires are disposed on the substrate. The third wire is adjacent to the second wire. The second and third wires cross the first wire, and a width of the third wire is less than that of the second wire. The first semiconductor element is overlapped the first and third wires. The second semiconductor element is overlapped the first wire and adjacent to the first semiconductor element. The conductor is disposed below the second semiconductor element. The first and the second semiconductor element each crosses the first wire in two parts and the two parts of the second semiconductor element is less than the two parts of the first semiconductor element in distance.

17 Claims, 11 Drawing Sheets

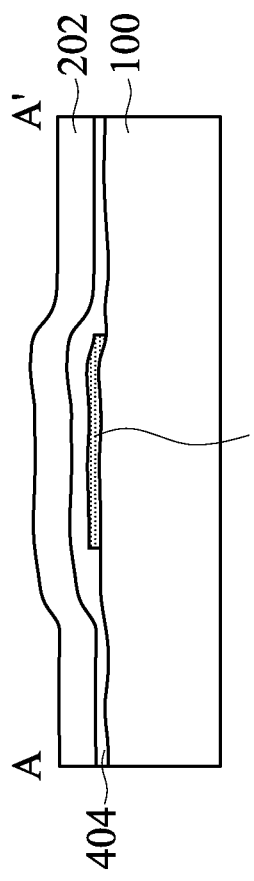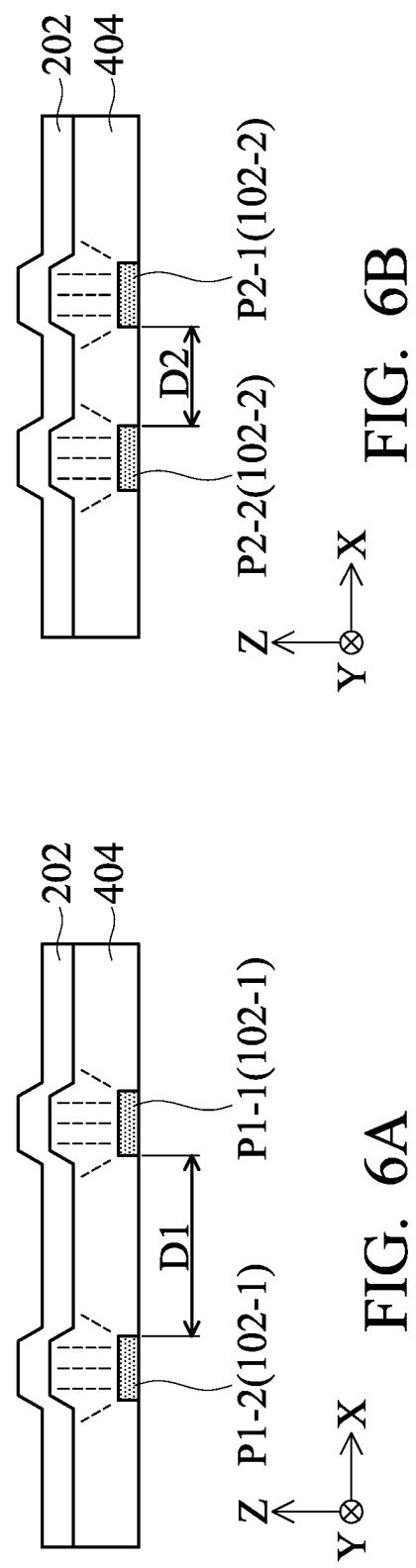
FIG. 5
FIG. 6A
FIG. 6B

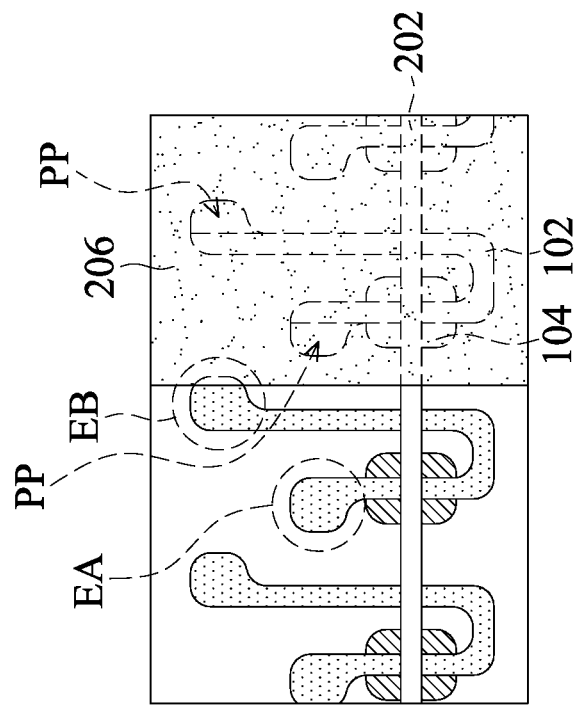
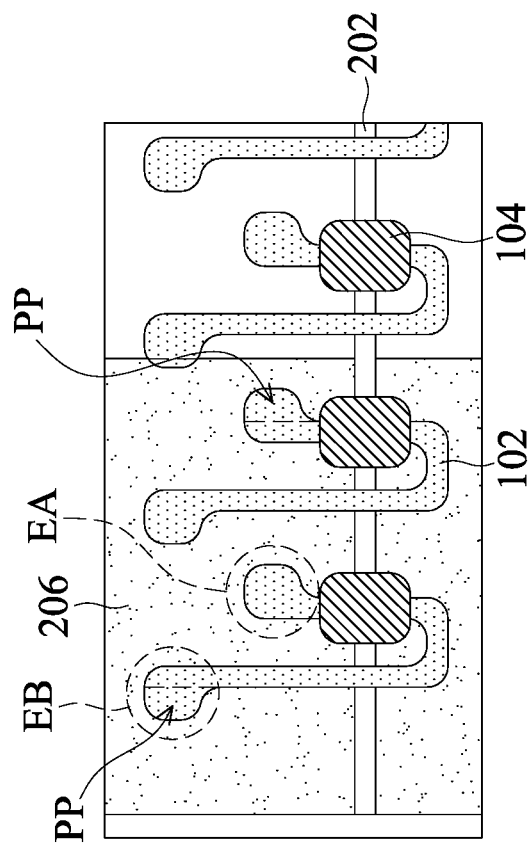
FIG. 9A
FIG. 9B

ELECTRONIC DEVICE

CROSS REFERENCE TO RELATED APPLICATIONS

This application is a Continuation of U.S. patent application Ser. No. 17/155,247, filed Jan. 22, 2021 and entitled "ELECTRONIC DEVICE", the entirety of which is incorporated by reference herein.

BACKGROUND

Technical Field

The present disclosure relates to an electronic device, and in particular it relates to an electronic device including a structure for electrostatic discharge (ESD) protection.

Description of the Related Art

Electronic devices such as display devices, antenna devices and sensor devices have become indispensable necessities in modern society. With the flourishing development of these electronic devices, consumers have high expectations regarding their quality, functionality, and price.

In the manufacturing process of electronic devices, static electricity may be generated in various steps or operations. The energy generated during electrostatic discharge may cause damage to the electronic devices. In particular, the damage of electrostatic discharge to electronic devices may include electrostatic breakdown, electrostatic dust absorption, electromagnetic interference (EMI) and so on.

The developments of the structural design that can improve the electrostatic discharge protection effect of the electronic device is still one of the goal in the current industry.

SUMMARY

In accordance with some embodiments of the present disclosure, an electronic device is provided. The electronic device includes a substrate, a first wire, a second wire, a third wire, a first semiconductor element, a second semiconductor element, and a conductor. The first wire is disposed on the substrate. The second wire is disposed on the substrate. The third wire is disposed on the substrate and adjacent to the second wire, wherein the second wire and the third wire cross the first wire, and a width of the third wire is less than a width of the second wire. The first semiconductor element is overlapped the first wire and the third wire. The second semiconductor element is overlapped the first wire and adjacent to the first semiconductor element. The conductor is disposed below the second semiconductor element. The first semiconductor element and the second semiconductor element each crosses the first wire in two parts and the two parts of the second semiconductor element is less than the two parts of the first semiconductor element in distance. The conductor is overlapped with at least one of the two parts of the second semiconductor element.

In accordance with some embodiments of the present disclosure, an electronic device is provided. The electronic device includes a substrate, a first wire, a second wire, a third wire, a first semiconductor element, a second semiconductor element, and a third semiconductor element. The first wire is disposed on the substrate. The second wire is disposed on the substrate. The third wire is disposed on the substrate and adjacent to the second wire, wherein the second wire and the third wire cross the first wire, and a width of the third wire is less than a width of the second wire. The first semiconductor element is overlapped the first wire and the third wire. The second semiconductor element is overlapped the first wire and adjacent to the first semiconductor element. The third semiconductor element is disposed on the substrate, wherein the second semiconductor element is disposed between the first semiconductor element and the third semiconductor element. The first semiconductor element and the second semiconductor element each crosses the first wire in two parts and the two parts of the second semiconductor element is less than the two parts of the first semiconductor element in distance.

In accordance with some embodiments of the present disclosure, an electronic device is provided. The electronic device includes a substrate, a first wire, a second wire, a third wire, a first semiconductor element, and a second semiconductor element. The first wire is disposed on the substrate. The second wire is disposed on the substrate. The third wire is disposed on the substrate and adjacent to the second wire, wherein the second wire and the third wire cross the first wire, and a width of the third wire is less than a width of the second wire. The first semiconductor element is overlapped the first wire and the third wire. The second semiconductor element is overlapped the first wire and adjacent to the first semiconductor element. The first semiconductor element and the second semiconductor element each crosses the first wire in two parts and the two parts of the second semiconductor element is less than the two parts of the first semiconductor element in distance. Each of the first semiconductor element and the second semiconductor element has a first end portion and a second end portion, and the first end portion is smaller than the second end portion in size. A distance between the first end portion and the second end portion of the second semiconductor element is less than a distance between the first end portion and the second end portion of the first semiconductor element.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 5 is a cross-sectional diagram of the electronic device along line segment A-A' in FIG. 3 in accordance with some embodiments of the present disclosure;

FIG. 6A is a diagram showing lines of electric force between elements of an electronic device in accordance with some embodiments of the present disclosure;

FIG. 6B is a diagram showing lines of electric force between elements of an electronic device in accordance with some embodiments of the present disclosure;

FIG. 9A is a bottom-view diagram of a portion of an electronic device in accordance with some embodiments of the present disclosure;

FIG. 9B is a top-view diagram of a portion of an electronic device in accordance with some embodiments of the present disclosure;

DETAILED DESCRIPTION

Figure 1:
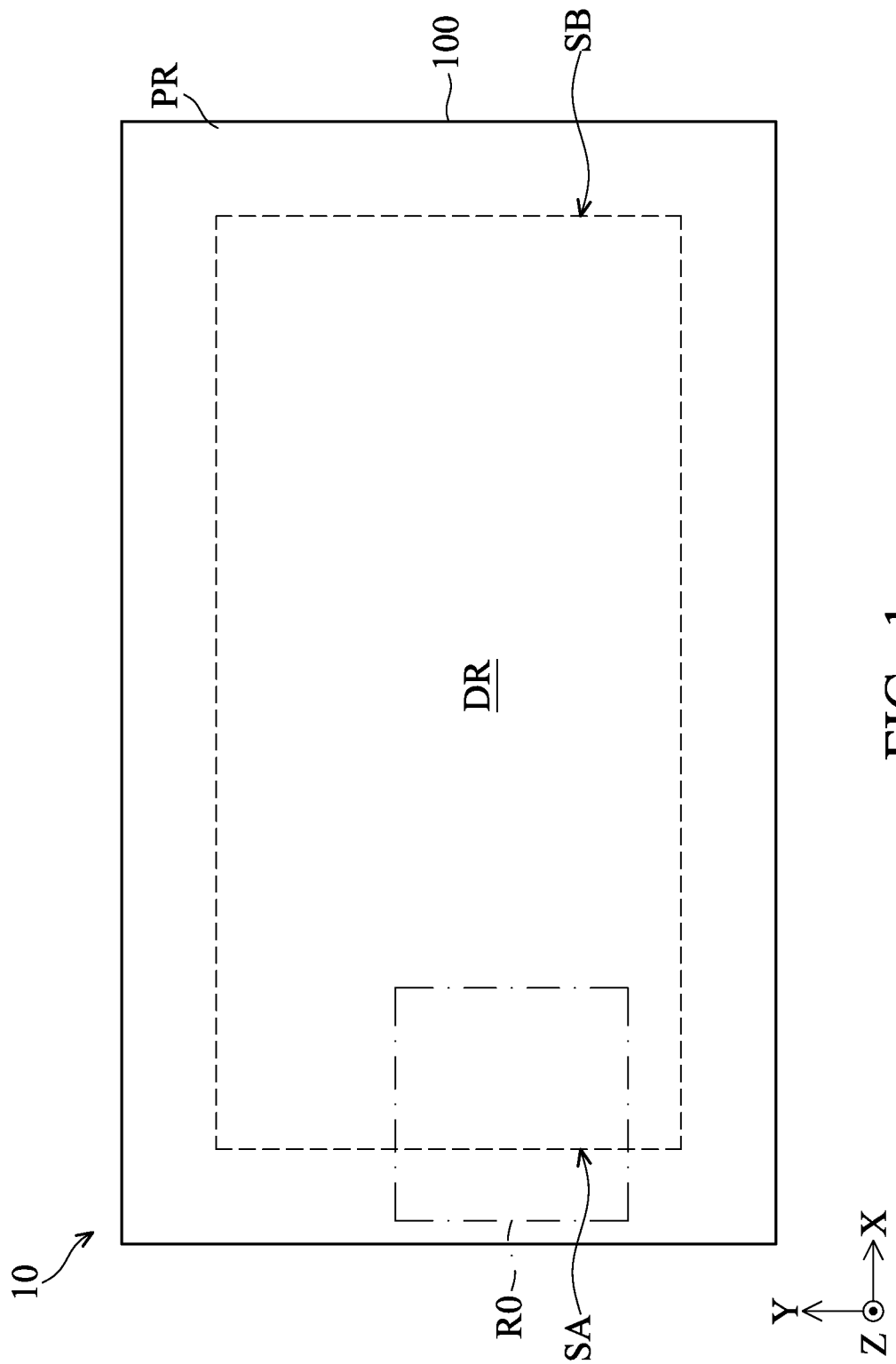
FIG. 1 is a top-view diagram of an electronic device in accordance with some embodiments of the present disclosure.

The electronic device of the present disclosure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent that the exemplary embodiments set forth herein are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

The descriptions of the exemplary embodiments are intended to be read in connection with the accompanying drawings, which are to be considered part of the entire written description. It should be understood that the drawings are not drawn to scale. In fact, the size of the element may be arbitrarily enlarged or reduced in order to clearly express the features of the present disclosure.

It should be understood that in the embodiments, relative expressions are used. For example, "lower", "bottom", "higher" or "top" are used to describe the position of one element relative to another. It should be appreciated that if a device is flipped upside down, an element that is "lower" will become an element that is "higher". It should be understood that when an element or layer is referred to as being "disposed on" another element or layer, it can be directly disposed on the other element or layer, or intervening elements or layers may be presented. In contrast, when an element is referred to as being "directly disposed on" another element or layer, there are no intervening elements or layers presented.

In some embodiments of the present disclosure, terms concerning connection, coupling and the like, such as "connected" and "interconnected", unless otherwise specifically defined, may refer to two structures being in direct contact, or may refer to two structures not being in direct contact and there are other structures between these two structures. In addition, the term "electrically connected to" may refer to "directly electrically connected to" or "indirectly electrically connected to".

In addition, it should be understood that, the ordinal numbers used in the specification and claims, such as the terms "first", "second", etc., are used to modify an element, which does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. The ordinal numbers used to modify the same element may be different in the claims and the specification. Accordingly, the term "first element" in the specification may refer to the "second element" in the claims.

The terms "about", "approximately" and "substantially" typically mean+/−10% of the stated value, or +/−5% of the stated value, or +/−3% of the stated value, or +/−2% of the stated value, or +/−1% of the stated value or +/−0.5% of the stated value. The stated value of the present disclosure is an approximate value. When there is no specific description, the stated value includes the meaning of "about", "approximately", or "substantially". Furthermore, the phrase "in a range from a first value to a second value" or "in a range between a first value and a second value" indicates that the range includes the first value, the second value, and other values between them.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, the following expression "the first element is disposed on the second element" includes the conditions where the first element and the second element are in direct contact, or another element is disposed between the first element and the second element so that they are not in direct contact. The following expression "the first element is disposed in the second element" includes the conditions where the first element is entirely in the second element, or the first element is partially in the second element. In accordance with some embodiments of the present disclosure, an electronic device is provided, and the electronic device has a structural design that can improve the protection effect for electrostatic discharge (ESD).

Refer to FIG. 1, which is a top-view diagram of an electronic device 10 in accordance with some embodiments of the present disclosure. It should be understood that only some of the elements of the electronic device 10 are illustrated in FIG. 1 for clarity.

In accordance with some embodiments, the electronic device 10 may include a display device, a tiled device, other suitable device, or a combination thereof, but it is not limited thereto. The display device may include a touch display device, a curved display device, or a free-shape display device. The tiled device may be, for example, a tiled display device. The electronic device 10 may be a bendable or flexible electronic device. In addition, the electronic device 10 may include light-emitting diodes (LEDs), fluorescence material, phosphor, quantum dot (QD), another suitable material, or a combination thereof, but it is not limited thereto. The light-emitting diode may include, for example, an inorganic light-emitting diode, an organic light-emitting diode (OLED), a mini light-emitting diode (mini LED), a micro light-emitting diode (micro LED), or a quantum dot (QD) light-emitting diode (QLED or QDLED), or a combination thereof, but it is not limited thereto. It should be noted that the electronic device 10 in the present disclosure can be any combination of the foregoing, but is not limited thereto. In addition, the shape of the electronic device 10 may be rectangular, circular, polygonal, a shape with curved edges, or other suitable shapes. In addition, in accordance with some embodiments, the electronic device 10 may have peripheral systems such as a driving system, a control system, a light source system, a shelf system, etc. to support a display device.

As shown in FIG. 1, in accordance with some embodiments, the electronic device 10 may include a substrate 100, and the substrate 100 may have a display region DR and a peripheral region PR adjacent to the display region DR. In accordance with some embodiments, the peripheral region PR may surround the display region DR. Specifically, in accordance with some embodiments, the electronic device 10 may be a display device, for example, an inorganic light-emitting diode display device, an organic light-emitting diode display device, a liquid-crystal display device, or a quantum dot (QD) light-emitting diode display device.

In accordance with some embodiments, a plurality of thin-film transistors(not illustrated) may be disposed on the substrate 100. In addition, the electronic device 10 may include an opposing substrate (not illustrated) disposed opposite to the substrate 100.

In accordance with some embodiments, the material of the substrate 100 may include glass, quartz, sapphire, ceramic, polyimide (PI), polycarbonate (PC), polyethylene terephthalate (PET), rubber, glass fiber, other suitable materials, or a combination thereof, but it is not limited thereto. In accordance with some embodiments, the substrate 100 may include a metal-glass fiber composite substrate, a metal-ceramic composite substrate, a printed circuit board, or any other suitable substrate, but it is not limited thereto. In addition, the transmittance of the substrate 100 is not particularly limited. That is, the substrate 100 may be a light-transmitting substrate, a semi-transmitting substrate, or a non-transmitting substrate.

Figure 2:
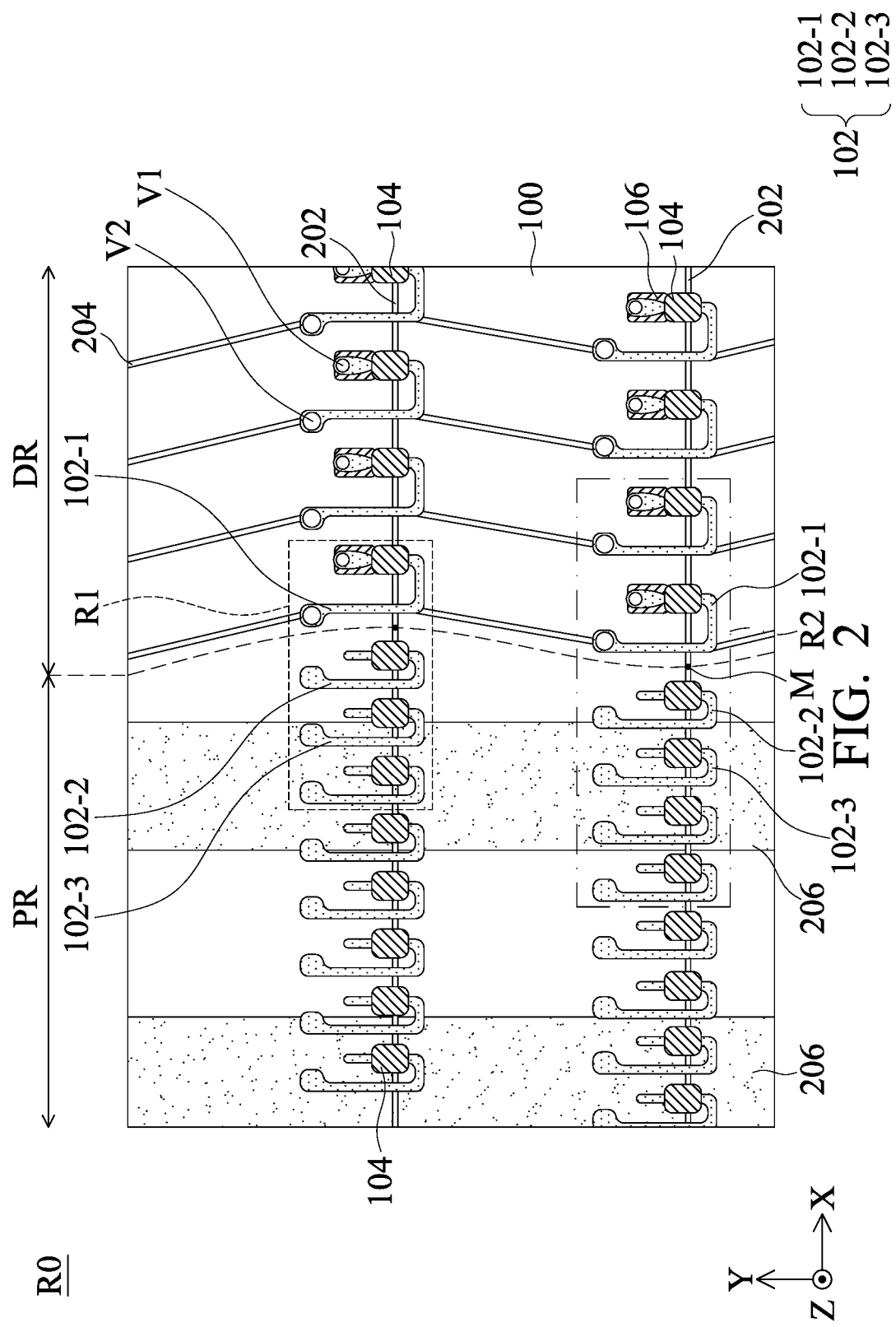
FIG. 2 is an enlarged bottom-view diagram of an area R0 of the electronic device in FIG. 1 in accordance with some embodiments of the present disclosure.

Refer to FIG. 2, which is an enlarged bottom-view diagram of an area R0 of the electronic device 10 in FIG. 1 in accordance with some embodiments of the present disclosure. Specifically, FIG. 2 may refer to the diagram of area R0 viewed from the backside of the electronic device 10, for example, the outer side of the substrate 100. It should be understood that, for clarity of description, some elements of the electronic device 10 are omitted in the figure. In accordance with some embodiments, additional features can be added to the electronic device 10 described below. In accordance with some other embodiments, some of the features of the electronic device 10 described below may be replaced or omitted.

In accordance with some embodiments, the electronic device 10 may include a first wire 202, a second wire 206, a third wire 204, and a plurality of semiconductor elements 102. The plurality of semiconductor elements 102 may include a first semiconductor element 102-1 and a second semiconductor element 102-2. The first wire 202 may be disposed in the display region DR and the peripheral region PR, and the first wire 202 may be partially overlapped with the semiconductor elements 102 in a normal direction of the substrate 100 (e.g., the Z direction in the drawing). As shown in FIG. 2, in accordance with some embodiments, the electronic device 10 may include a plurality of first wires 202 and at least one of the first wires 202 crosses the plurality of semiconductor elements 102 in both of the display region DR and the peripheral region PR.

In accordance with some embodiments, the first semiconductor element 102-1 may be disposed in the display region DR and the second semiconductor element 102-2 may be disposed in the peripheral region PR and adjacent to the first semiconductor element 102-1.

In accordance with some embodiments, the plurality of semiconductor elements 102 (including the first semiconductor element 102-1 and the second semiconductor element 102-2) may include a semiconductor material. The semiconductor material may include, but is not limited to, amorphous silicon (a-Si), low temperature polysilicon (LTPS), indium gallium zinc oxide (IGZO), metal oxides, or a combination thereof. In addition, in accordance with some embodiments, different semiconductor elements 102 in the electronic device 10 may be formed of different materials as described above. For example, some of the semiconductor elements 102 may include low temperature polysilicon and some of the semiconductor elements 102 may include metal oxides.

In accordance with some embodiments, the first semiconductor element 102-1 in the display region DR may serve as a semiconductor layer (active layer) of a transistor and the second semiconductor element 102-2 in the peripheral region PR may provide electrostatic discharge protection effect, but they are not limited thereto. In addition, the transistor described herein may include, but is not limited to, a top-gate transistor, a bottom-gate transistor, a dual-gate, double-gate transistor, or a combination thereof. In accordance with some embodiments, the first semiconductor element 102-1 and the second semiconductor element 102-2 may have a bent shape (e.g., a U-shape) and the first semiconductor element 102-1 and the second semiconductor element 102-2 may be overlapped with the first wire 202 by two parts, but it is not limited thereto.

In accordance with some embodiments, the third wire 204 may be electrically connected to the first semiconductor element 102-1 disposed in the display region DR. Specifically, the third wire 204 may be electrically connected to the first semiconductor element 102-1 through a via V2.

In accordance with some embodiments, the first semiconductor element 102-1 may be the outmost semiconductor element in the display region DR (e.g., as shown in FIG. 1, the outmost semiconductor element may be closest to a side SA and a side SB of the display region DR), or the first or the last one semiconductor element in a row that is electrically connected to the third wire 204. In accordance with some embodiments, as shown in FIG. 2, the electronic device 10 may include a plurality of first semiconductor elements 102-1, and the first semiconductor elements 102-1 may be arranged along an extending direction of the third wire 204 (e.g., the Y direction in the drawing). In accordance with some embodiments, the second semiconductor element 102-2 may be a semiconductor element that is closest to the first semiconductor element 102-1 in the peripheral region PR. In accordance with some embodiments, as shown in FIG. 2, the electronic device 10 may include a plurality of second semiconductor elements 102-2, and the second semiconductor elements 102-2 may be arranged along the extending direction of the third wire 204. In addition, in accordance with some embodiments, the plurality of semiconductor elements 102 include a third semiconductor element 102-3, the third semiconductor element 102-3 may be the semiconductor element that is closest to the second semiconductor element 102-2 in the peripheral region PR. In accordance with some embodiments, the electronic device 10 may also include a plurality of third semiconductor elements 102-3. In addition, the second semiconductor elements 102-2 may be disposed between the first semiconductor elements 102-1 and the third semiconductor elements 102-3.

In accordance with some embodiments, the first wire 202 may be a scan line, but it is not limited thereto. In accordance with some embodiments, the material of the first wire 202 may include a conductive material. In accordance with some embodiments, the conductive material may include, but is not limited to, a metal conductive material, a transparent conductive material, or a combination thereof. For example, the metal conductive material may include, but is not limited to, molybdenum (Mo), copper (Cu), aluminum (Al), tungsten (W), titanium (Ti), gold (Au), platinum (Pt), nickel (Ni), molybdenum alloy, copper alloy, aluminum alloy, tungsten alloy, titanium alloy, gold alloy, platinum alloy, nickel alloy, other suitable conductive materials, or a combination thereof. The transparent conductive material may include transparent conductive oxide (TCO). For example, the transparent conductive oxide may include, but is not limited to, indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), other suitable transparent conductive materials, or a combination thereof.

In accordance with some embodiments, the second wire 206 and the third wire 204 may be partially overlapped with the first wire 202 in a normal direction of the substrate 100 (e.g., the Z direction in the drawing). In accordance with some embodiments, the electronic device 10 may include a plurality of third wires 204 disposed in the display region DR, the third wires 204 may intersect with the first wires 202 and define a plurality of pixels. In accordance with some embodiments, some of the second semiconductor elements 102-2 in the peripheral region PR may be partially overlapped with the second wire 206 in a normal direction of the substrate 100 (e.g., the Z direction in the drawing).

In accordance with some embodiments, the second wire 206 may be a common line, for example, a common power line, or a common voltage line. In accordance with some embodiments, the third wire 204 may be a data line.

In accordance with some embodiments, the material of the second wire 206 and the third wire 204 may be similar to those of the first wire 202 as described above, and thus will not be repeated here.

Moreover, in accordance with the embodiments of the present disclosure, a boundary of the display region DR and the peripheral region PR refers to a line that passes through a middle point M of a minimum distance between the first semiconductor element 102-1 and the second semiconductor element 102-2. In addition, the middle point M is overlapped with the first wire 202 in the normal direction of the substrate 100 (e.g., the Z direction in the drawing), and the line is substantially parallel to an extending direction of the third wire 204.

Refer to FIG. 2, in accordance with some embodiments, the electronic device 10 may further include a conductor 104, and the conductor 104 may be partially overlapped with the first wire 202 in the normal direction of the substrate 100 (e.g., the Z direction in the drawing). In accordance with some embodiments, the electronic device 10 may include a plurality of conductors 104, and the conductors 104 may be overlapped with the semiconductor elements 102 in both of the display region DR and the peripheral region PR. In accordance with some embodiments, the conductors 104 may be overlapped with a part of the semiconductor elements 102, but not overlapped with another part of the semiconductor elements 102. Specifically, the conductor 104 disposed in the peripheral region PR may serve as an element for protecting electrostatic discharge occurring in the display region DR, and the details will be described below. On the other hand, the conductor 104 disposed in the display region DR may serve as a light-shielding layer.

In accordance with some embodiments, the material of conductor 104 may include a conductive material. The conductive material may be similar to those of the first wire 202 as described above, and thus will not be repeated here.

Figure 3:
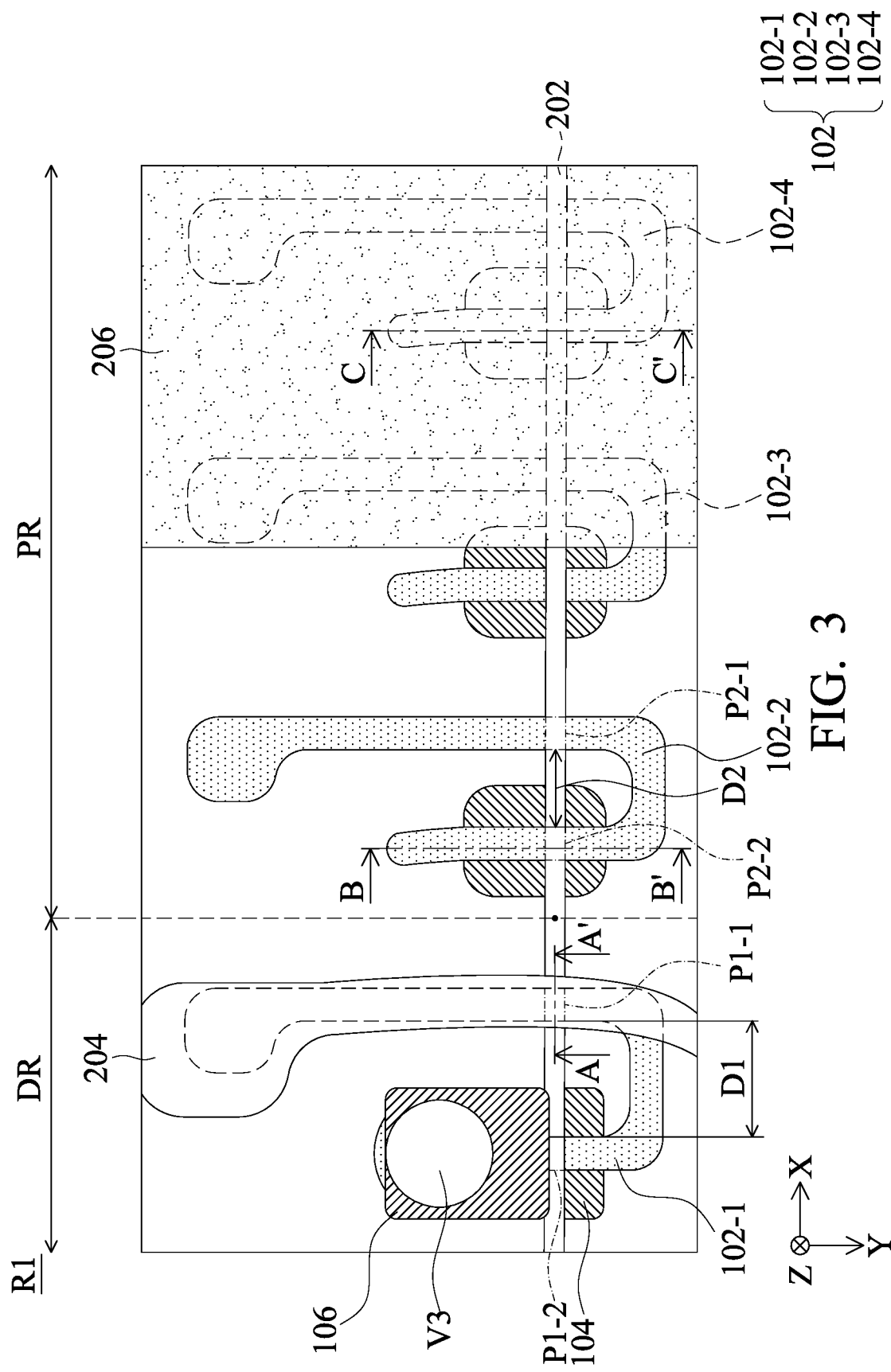
FIG. 3 is an enlarged top-view diagram of an area R1 of the electronic device in FIG. 2 in accordance with some embodiments of the present disclosure.

Refer to FIG. 3, which is an enlarged top-view diagram of an area R1 of the electronic device 10 in FIG. 2 in accordance with some embodiments of the present disclosure. Specifically, FIG. 3 may refer to the diagram of area R1 viewed from the front side of the electronic device 10, for example, the inner side of the substrate 100. It should be understood that, for clarity of description, some elements of the electronic device 10 are omitted in FIG. 3.

As shown in FIG. 3, in accordance with some embodiments, the second wire 206 may be disposed on the first wire 202 and overlapped with some of the semiconductor elements 102. Specifically, in addition to the first semiconductor element 102-1, the second semiconductor element 102-2 and the third semiconductor element 102-3 described above, the plurality of semiconductor elements 102 may further include a fourth semiconductor element 102-4 adjacent to the third semiconductor element 102-3. The third semiconductor element 102-3 may be disposed between the second semiconductor element 102-2 and the fourth semiconductor element 102-4. In accordance with some embodiments, as shown in FIG. 2 and FIG. 3, the second wire 206 may be partially overlapped with the second semiconductor element 102-2 and/or the third semiconductor element 102-3 in the peripheral region PR. In accordance with some embodiments, the second wire 206 may be entirely overlapped with the fourth semiconductor element 102-4 in the peripheral region PR, but it is not limited thereto.

As shown in FIG. 2 and FIG. 3, in accordance with some embodiments, an electrode layer (not illustrated) may be electrically connected to the first semiconductor element 102-1 through a pad 106. In detail, the pad 106 may be electrically connected to the first semiconductor element 102-1 through a via V1, and the electrode layer may be electrically connected to the pad 106 through a via V3. The electrode layer may be a pixel electrode of the electronic device 10, but it is not limited thereto. In accordance with some embodiments, the conductor 104 may be disposed below the semiconductor element 102 and partially overlapped with the semiconductor element 102.

In addition, in accordance with some embodiments, the first semiconductor element 102-1 and the second semiconductor element 102-2 may cross the first wire 202 in two parts respectively, and the two parts of the second semiconductor element 102-2 in the peripheral region PR may be less than the two parts of the first semiconductor element 102-1 in the display region DR in distance. Moreover, in accordance with some embodiments, the conductor 104 may be overlapped with at least one of the two parts of the first semiconductor element 102-1 and/or the second semiconductor element 102-2.

Specifically, as shown in FIG. 3, the first semiconductor element 102-1 and the second semiconductor element 102-2 may cross the first wire 202 in two parts respectively and the two parts of the second semiconductor element 102-2 may be less than the two parts of the first semiconductor element 102-1 in distance. More specifically, the first semiconductor element 102-1 may cross the first wire 202 in a first part P1-1 and a second part P1-2, and the second semiconductor element 102-2 may cross the first wire 202 in a first part P2-1 and a second part P2-2. Moreover, a distance D2 in the X direction between the first part P2-1 and the second part P2-2 may be less than a distance D1 in the X direction between the first part P1-1 and the second part P1-2. It should be noted that the X direction is a extending direction of the first wire 202.

In accordance with the embodiments of the present disclosure, the distance D1 may refer to a minimum distance between the first part P1-1 and the second part P1-2, and the first part P1-1 and the second part P1-2 are the portions of the first semiconductor element 102-1 that are overlapped with the first wire 202 in the normal direction of the substrate 100 (e.g., the Z direction in the drawing). Similarly, in accordance with the embodiments of the present disclosure, the distance D2 may refer to a minimum distance between the first part P2-1 and the second part P2-2, and the first part P2-1 and the second part P2-2 are the portions of the second semiconductor element 102-2 that are overlapped with the first wire 202 in the normal direction of the substrate 100 (e.g., the Z direction in the drawing).

It should be noted that since distance D2 is less than distance D1, static electric charges accumulate more easily in the second semiconductor element 102-2 than the first semiconductor element 102-1. More specifically, static electric charges accumulate more easily at the portion of the second semiconductor element 102-2 that overlaps the first wire 202, and the electric field near the second semiconductor element 102-2 is stronger than the one near the first semiconductor element 102-1. Therefore, an electrostatic discharge is more likely to occur at the second semiconductor element 102-2 in the peripheral region PR than the first semiconductor element 102-1 in the display region DR. The display region DR of the electronic device 10 may be protected from damage due to electrostatic discharge.

Moreover, in accordance with some embodiments, the two parts of the second semiconductor element 102-2 may be less than half of the two parts of the first semiconductor element 102-1 in distance. Specifically, as shown in FIG. 3, the distance D2 between the first part P2-1 and the second part P2-2 may be less than half of the distance D1 between the first part P1-1 and the second part P1-2. In accordance with some embodiments, a ratio of the distance D2 between the two parts (i.e. the first part P2-1 and the second part P2-2) of the second semiconductor element 102-2 to the distance D1 between the two parts (i.e. the first part P1-1 and the second part P1-2) of the first semiconductor element 102-1 may be greater than or equal to 0.2 and less than or equal to 0.7 (i.e. 0.2≤ratio D2/D1≤0.7), or greater than or equal to 0.3 and less than or equal to 0.6, such as 0.4 or 0.5.

More specifically, in some embodiments, the distance D1 and the distance D2 may be 8.69 micrometers (μm) and 4.05 μm respectively, and the ratio D2/D1 may be 0.466. In some embodiments, the distance D1 and the distance D2 may be 7.72 μm and 3.76 μm respectively, and the ratio D2/D1 may be 0.487. In some embodiments, the distance D1 and the distance D2 may be 7.72 μm and 3.09 μm respectively, and the ratio D2/D1 may be 0.4. In some embodiments, the distance D1 and the distance D2 may be 8.59 μm and 3.48 μm respectively, and the ratio D2/D1 may be 0.405. In some embodiments, the distance D1 and the distance D2 may be 8.11 μm and 3.86 μm respectively, and the ratio D2/D1 may be 0.476. In some embodiments, the distance D1 and the distance D2 may be 8.98 μm and 4.25 μm respectively, and the ratio D2/D1 may be 0.473.

In addition, it should be noted that if the ratio of distance D2 to distance D1 is too small (for example, less than 0.2), the process for manufacturing the second semiconductor element 102-2 may become difficult; on the other hand, if the ratio of distance D2 to distance D1 is too large (for example, greater than 0.7), there may be insufficient protection of the display region DR against damage due to electrostatic discharge.

Figure 4:
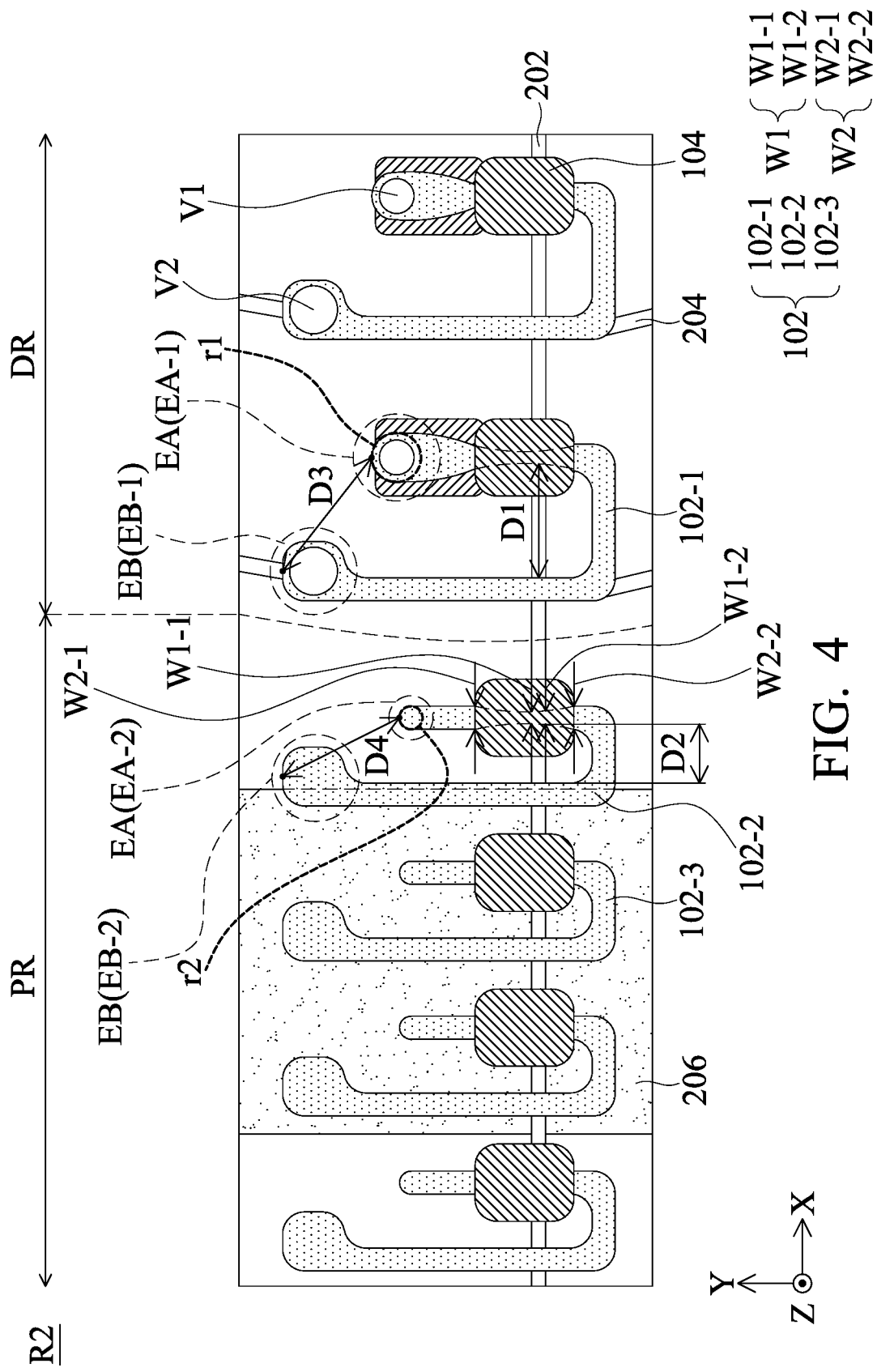
FIG. 4 is an enlarged bottom-view diagram of an area R2 of the electronic device in FIG. 2 in accordance with some embodiments of the present disclosure.

Next, refer to FIG. 4, which is an enlarged bottom-view diagram of an area R2 of the electronic device 10 in FIG. 2 in accordance with some embodiments of the present disclosure. Specifically, FIG. 4 may refer to the diagram of area R2 viewed from the backside of the electronic device 10, for example, the outer side of the substrate 100. It should be understood that, for clarity of description, some elements of the electronic device 10 are omitted in FIG. 4.

As shown in FIG. 4, in accordance with some embodiments, a width W1 of the semiconductor element 102 that is overlapped with the conductor 104 and the first wire 202 may be less than a width W2 of the semiconductor element 102 that is overlapped with the conductor 104 but not the first wire 202.

In accordance with the embodiments of the present disclosure, the width W1 may refer to an average width of the semiconductor element 102 that is overlapped with the conductor 104 and the first wire 202 along the direction substantially parallel to the extending direction of the first wire 202 (e.g., the X direction in the drawing). Specifically, the average width W1 may refer to an average of an upper width W1-1 and a lower width W1-2 of the portion of the semiconductor element 102 that is overlapped with the conductor 104 and the first wire 202. Similarly, in accordance with the embodiments of the present disclosure, the width W2 may refer to an average width of the semiconductor element 102 that is overlapped with the conductor 104 but not the first wire 202 along the direction substantially parallel to the extending direction of the first wire 202 (e.g., the X direction in the drawing). Specifically, the average width W2 may refer to an average of an upper width W2-1 and a lower width W2-2 of the portion of the semiconductor element 102 that is overlapped with the conductor 104 but not the first wire 202.

Moreover, in accordance with the embodiments of the present disclosure, the width and the length of the component can be measured from an optical microscope image, and the thickness of the component can be measured from a cross-sectional image in an electron microscope, but it is not limited thereto. In accordance with some embodiments, an optical microscope (OM), a scanning electron microscope (SEM), a film thickness profiler (α-step), an ellipsometer or another suitable method may be used to measure the width, length, thickness of each element or the distance between elements. Specifically, in accordance with some embodiments, a scanning electron microscope can be used to obtain any cross-sectional image including the elements to be measured, and the width, length, thickness or distance between the elements in the image can be measured.

Referring to FIG. 4, in accordance with some embodiments, each of the first semiconductor element 102-1 and the second semiconductor element 102-2 may have a first end portion EA and a second end portion EB, and the first end portion EA may be smaller than the second end portion EB in size. For example, a radius of the first end portion EA may be smaller than a radius of the second end portion EB or an area of the first end portion EA may be smaller than an area of the second end portion EB. In accordance with some embodiments, the radius or the area can be measured using the OM Tools software. In accordance with some embodiments, the first end portion EA may be closer to the first wire 202 (the portion that the first end portion EA and the second end portion EB overlap with) than the second end portion EB along a direction that is substantially perpendicular to the extending direction of the first wire 202 (e.g., the Y direction in the drawing). Specifically, for clarity of description, the first end portion EA and the second end portion EB of the first semiconductor element 102-1 are labeled as EA-1 and EB-1 respectively in the figure. In accordance with some embodiments, the via V1 may be located in the first end portion EA-1, and the via V2 may be located in the second end portion EB-1.

In addition, in accordance with some embodiments, a distance D4 between the first end portion EA-2 and the second end portion EB-2 of the second semiconductor element 102-2 may be less than a distance D3 between the first end portion EA-1 and the second end portion EB-1 of the first semiconductor element 102-1. Specifically, the distance D3 may refer to the distance between the two points respectively on the first end portion EA-1 and the second end portion EB-1 that are farthest away from the first wire 202. The distance D4 may refer to the distance between the two points respectively on the first end portion EA-2 and the second end portion EB-2 that are farthest away from the first wire 202.

It should be noted that since distance D4 is shorter than distance D3, static electric charges accumulate more easily in the second semiconductor element 102-2 than in the first semiconductor element 102-1. More specifically, static electric charges accumulated more easily between the first end portion EA-2 and the second end portion EB-2 of the second semiconductor element 102-2, and the electric field near the second semiconductor element 102-2 is stronger than the one near the first semiconductor element 102-1. Therefore, an electrostatic discharge is more likely to occur at the second semiconductor element 102-2 in the peripheral region PR than at the first semiconductor element 102-1 in the display region DR. The display region DR of the electronic device 10 may be protected from the damage caused by electrostatic discharge.

Moreover, in accordance with some embodiments, a ratio of the distance D4 between the first end portion EA-2 and the second end portion EB-2 of the second semiconductor element 102-2 to the distance D3 between the first end portion EA-1 and the second end portion EB-1 of the first semiconductor element 102-1 may be greater than or equal to 0.4 and less than 1 (i.e. 0.4≤ratio D4/D3<1), or greater than or equal to 0.6 and less than or equal to 0.9, such as 0.7 or 0.8.

More specifically, in some embodiments, distance D3 and distance D4 may be 15.57 μm and 13.08 μm respectively, and the ratio of D4 to D3 may be 0.840. In some embodiments, distance D3 and distance D4 may be 13.35 μm and 11.64 μm respectively, and the ratio of D4 to D3 may be 0.872. In some embodiments, distance D3 and distance D4 may be 14.02 μm and 10.43 μm respectively, and the ratio of D4 to D3 may be 0.744. In some embodiments, distance D3 and distance D4 may be 13.34 μm and 10.21 μm respectively, and the ratio of D4 to D3 may be 0.765. In some embodiments, distance D3 and distance D4 may be 15.05 μm and 10.53 μm respectively, and the ratio of D4 to D3 may be 0.70. In some embodiments, distance D3 and distance D4 may be 14.92 μm and 10.49 μm respectively, and the ratio of D4 to D3 may be 0.703.

In addition, it should be noted that if the ratio of distance D4 to distance D3 is too small (for example, less than 0.4), the process for manufacturing the second semiconductor element 102-2 may become difficult; on the other hand, if the ratio of distance D4 to distance D3 is too large (for example, greater than 1), there may be insufficient protection of the display region DR against damage due to electrostatic discharge.

Furthermore, in accordance with some embodiments, the first end portion EA-2 of the second semiconductor element 102-2 may be less than the first end portion EA-1 of the first semiconductor element 102-1 in radius of curvature. In other words, the first end portion EA-2 may have a smaller radius of curvature than the first end portion EA-1. In accordance with some embodiments, a radius of curvature of the first end portion EA-2 may be greater than or equal to 0.5 μm, and less than or equal to 2 μm, but it is not limited thereto. In accordance with some embodiments, a radius of curvature of the first end portion EA-1 may be greater than or equal to 0.8 μm, and less than or equal to 3.5 μm, but it is not limited thereto. For example, the radius of curvature of the first end portion EA-2 is equal to 1.46 m and the radius of curvature of the first end portion EA-1 is equal to 2.13 μm. In some embodiments, the radius of curvature of the first end portion EA-2 is equal to 1.16 μm and the radius of curvature of the first end portion EA-1 is equal to 1.91 μm. In another embodiment, the radius of curvature of the first end portion EA-2 is equal to 1.37 μm and the radius of the first end portion EA-1 is equal to 1.75 μm. In accordance with some embodiments, the radius of curvature of the first end portion EA-2 is equal to 1.08 μm and the radius of the first end portion EA-1 is equal to 1.65 μm.

In accordance with the embodiments of the present disclosure, the radius of curvature of the end portions can be measured using the OM Tools software. Specifically, the function of using three points to determine a circle can be applied to measure the radius of curvature. For example, as shown in FIG. 4, the radius of curvatures r1 and r2 of the end portions EA can be measured by using the OM Tools software.

As described above, the radius of curvature of the first end portion EA-2 of the second semiconductor element 102-2 is less than that of the first end portion EA-1 of the first semiconductor element 102-1. In other words, the first end portion EA-2 is shaper than the first end portion EA-1. According to the corona discharge mechanism, an electrostatic discharge is more likely to occur at the second semiconductor element 102-2 in the peripheral region PR than the first semiconductor element 102-1 in the display region DR. Therefore, the display region DR of the electronic device 10 may be protected from damage due to electrostatic discharge.

More specifically, in accordance with some embodiments, a ratio of the radius of curvature of the first end portion EA-2 to the radius of curvature of the first end portion EA-1 may be greater than or equal to 0.3 and less than or equal to 0.9 (i.e. 0.3≤ratio of radius of curvature≤0.9), or greater than or equal to 0.4 and less than or equal to 0.8, such as 0.5, 0.6 or 0.7.

Next, refer to FIG. 5, which is a cross-sectional diagram of the electronic device along line segment A-A' in FIG. 3 in accordance with some embodiments of the present disclosure. It should be understood that FIG. 5 only illustrates the substrate 100, the semiconductor element 102, an insulating layer 404 and the first wire 202 for clarity.

As shown in FIG. 5, the insulating layer 404 and the first wire 202 may be disposed on the substrate 100, and the first wire 202 may be also disposed on the semiconductor element 102. In accordance with some embodiments, the insulating layer 404 and the first wire 202 may be conformally formed on the semiconductor element 102 and have an uneven top surface since the semiconductor element 102 is disposed below it. In accordance with some embodiments, the top surface of the first wire 202 may have a protruding portion.

Refer to FIG. 6A and FIG. 6B, which are diagrams showing lines of electric force between elements of an electronic device in accordance with some embodiments of the present disclosure. FIG. 6A and FIG. 6B are shown to further describe why the electrostatic discharge is more likely occurred at the second semiconductor element 102-2 in the peripheral region PR than the first semiconductor element 102-1 in the display region DR, and they only illustrate parts of the semiconductor element 102, the insulating layer 404 and the first wire 202 for clarity.

As shown in FIG. 6A and FIG. 6B, in accordance with some embodiments, the first wire 202 and the semiconductor elements 102 (the first semiconductor element 102-1 and the second semiconductor element 102-2) may be spaced apart by the insulating layer 404. The lines of electric force (indicated as dashed lines) are generated between the first wire 202 and the first semiconductor element 102-1, and between the first wire 202 and the second semiconductor element 102-2. Since the distance D1 between the first part P1-1 and the second part P1-2 of the first semiconductor element 102-1 is greater than the distance D2 between the first part P2-1 and the second part P2-2 of the second semiconductor element 102-2, the density of the lines of electric force per unit area near the first semiconductor element 102-1 is less than that near the second semiconductor element 102-2. Accordingly, static electric charges accumulate more easily in the second semiconductor element 102-2 than the first semiconductor element 102-1. An electrostatic discharge is more likely to occur at the second semiconductor element 102-2 than the first semiconductor element 102-1.

Figure 7:
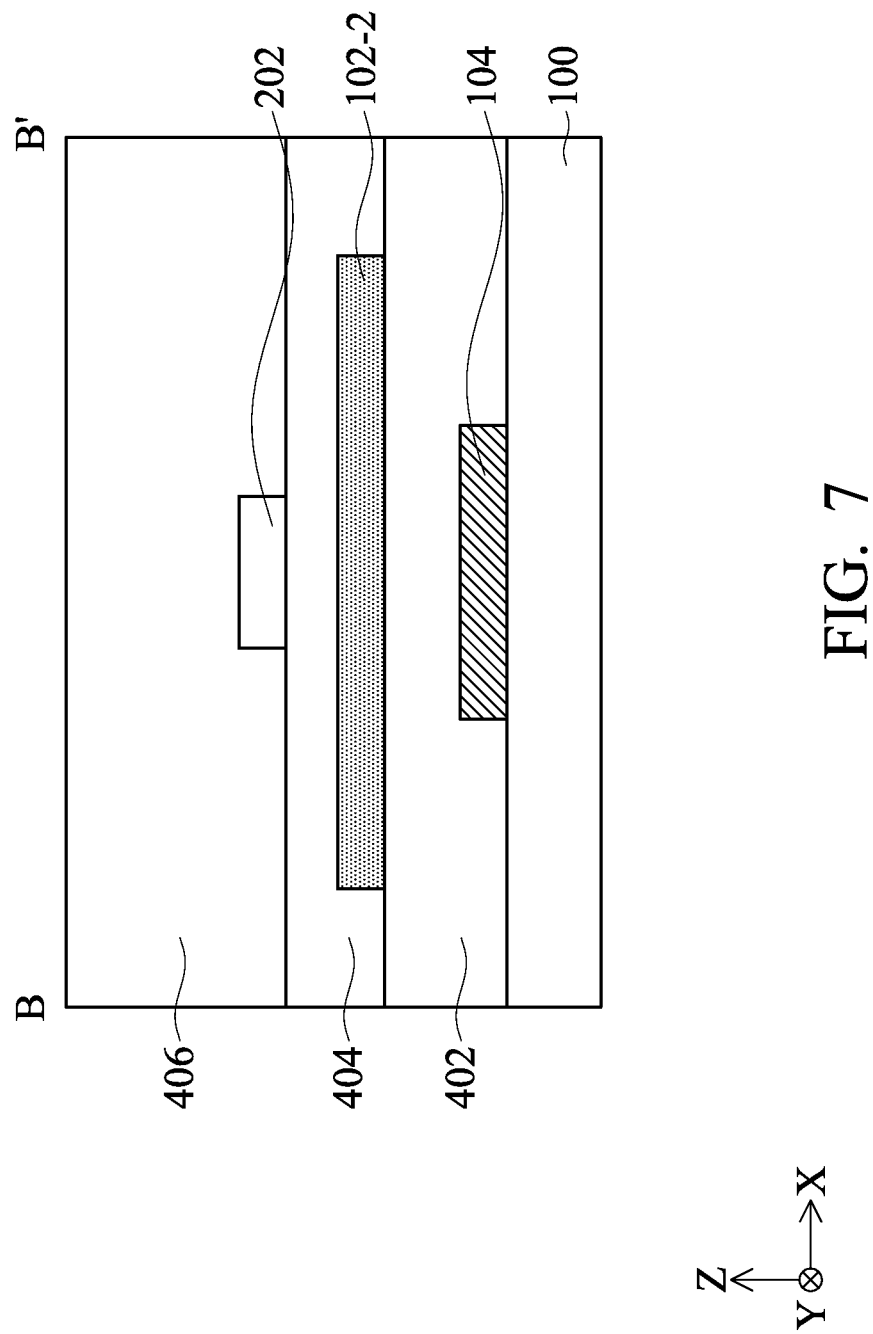
FIG. 7 is a cross-sectional diagram of the electronic device along line segment B-B' in FIG. 3 in accordance with some embodiments of the present disclosure.

Next, refer to FIG. 7, which is a cross-sectional diagram of the electronic device along line segment B-B' in FIG. 3 in accordance with some embodiments of the present disclosure. FIG. 7 is shown to describe the electrostatic discharge pathway in the electronic device.

As shown in FIG. 7, the conductor 104 and a functional layer 402 may be disposed on the substrate 100 and the functional layer 402 may cover the conductor 104. In addition, in accordance with the embodiments of the present disclosure, the expression "the first element covers the second element" includes the conditions where there is another element between the first element and the second element, or there is no other element between the first element and the second element. The semiconductor element 102 (102-2) and the insulating layer 404 may be disposed on the functional layer 402 and the insulating layer 404 may cover the semiconductor element 102. In addition, the first wire 202 and an insulating layer 406 may be disposed on the insulating layer 404 and the insulating layer 406 may cover the first wire 202.

In accordance with some embodiments, the functional layer 402 may serve as a buffer layer. The material of the functional layer 402 may include an organic material, an inorganic material, or a combination thereof, but it is not limited thereto. The organic material may include polyethylene terephthalate (PET), polyethylene (PE), polyether-sulfone (PES), polycarbonate (PC), polymethylmethacrylate (PMMA), isoprene, phenol-formaldehyde resin, benzocyclobutene (BCB), perfluorocyclobutane (PECB), or a combination thereof, but it is not limited thereto. The inorganic material may include silicon nitride, silicon oxide, silicon oxynitride, or a combination thereof, but it is not limited thereto. In accordance with some embodiments, the material of the insulating layer 404 and the insulating layer 406 may include silicon oxide, silicon nitride, silicon oxynitride, high-k dielectric material, other suitable dielectric materials, or a combination thereof, but it is not limited thereto. For example, the high-k dielectric material may include, but is not limited to, metal oxide, metal nitride, metal silicide, metal aluminate, zirconium silicate, zirconium aluminate, or a combination thereof. Moreover, the material of the insulating layer 404 may be the same as or different from the insulating layer 406.

In accordance with some embodiments, a thickness of the functional layer 402 may be in a range from 0.1 µm to 1 µm (i.e. 0.1 µm≤thickness of the functional layer 402 1 km), or from 0.1 µm to 0.5 µm, for example, 0.2 µm, 0.3 µm, or 0.4 µm. In accordance with some embodiments, a thickness of the insulating layer 404 may be in a range from 0.05 µm to 0.8 µm (i.e. 0.05 µm≤thickness of the insulating layer 404≤0.8 µm), or from 0.05 µm to 0.4 µm, for example, 0.1 µm, 0.2 µm, or 0.3 µm. In accordance with some embodiments, a thickness of the insulating layer 406 may be in a range from 0.2 µm to 1.5 µm (i.e. 0.2 µm≤thickness of the insulating layer 406≤1.5 µm), or from 0.3 µm to 0.8 µm, for example, 0.4 µm, 0.5 km, 0.6 µm, or 0.7 µm. In accordance with some embodiments, a ratio of thickness of the functional layer 402 to thickness of the insulating layer 404 to thickness of the insulating layer 406 may be 2.7:1:5.6, but it is not limited thereto. Specifically, in accordance with some embodiments, the thickness of the functional layer 402 may be 0.278 µm, the thickness of the insulating layer 404 may be 0.104 µm, and the thickness of the insulating layer 406 may be 0.584 µm.

When the static electric charges overly accumulated in the first wire 202, the electrostatic discharge may occur, and static electric charges may discharge from the first wire 202 to the semiconductor element 102 (102-2). In accordance with some embodiments, the breakdown voltage between the first wire 202 and the semiconductor element 102 (102-2) (i.e. the voltage that is required to penetrate through the insulating layer 404) may be in a range from 75V to 95V, but it is not limited thereto. Moreover, when static electric charges overly accumulated in the semiconductor element 102 (102-2), the electrostatic discharge may occur, and static electric charges may discharge from the semiconductor element 102 to the conductor 104. In accordance with some embodiments, the breakdown voltage between the semiconductor element 102 (102-2) and the conductor 104 (i.e. the voltage that is required to penetrate through the functional layer 402) may be in a range from 200V to 250V, but it is not limited thereto.

As described above, the conductor 104 may provide an additional electrostatic discharge pathway for the electronic device, and therefore the electronic device may be protected from the damage due to electrostatic discharge.

Figure 8:
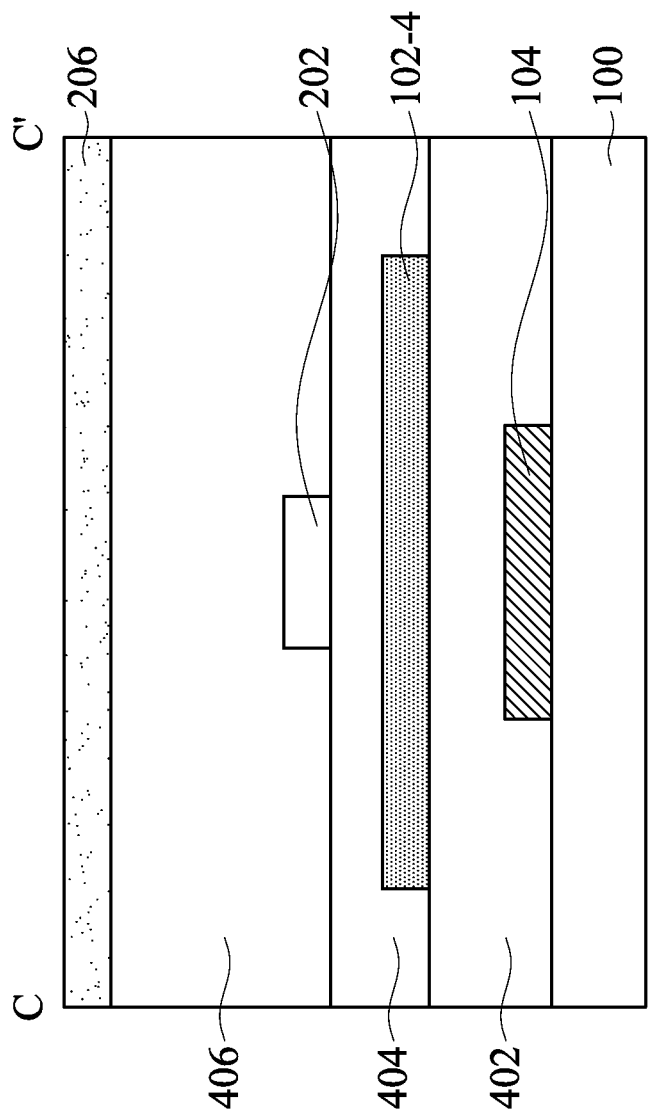
FIG. 8 is a cross-sectional diagram of the electronic device along line segment C-C' in FIG. 3 in accordance with some embodiments of the present disclosure.

Next, refer to FIG. 8, which is a cross-sectional diagram of the electronic device along line segment C-C' in FIG. 3 in accordance with some embodiments of the present disclosure. FIG. 8 is shown to describe the electrostatic discharge pathway in the electronic device. In addition, the same or similar components (or elements) in the following paragraph will be denoted by the same or similar reference numbers, and their materials, manufacturing methods and functions are the same or similar to those described above, and thus they will not be repeated in the following context.

As shown in FIG. 8, in the peripheral region PR, the second wire 206 may be overlapped with some of the semiconductor elements 102 (e.g., the fourth semiconductor element 102-4). The second wire 206 may be disposed on the insulating layer 406. The semiconductor element 102 may be overlapped with both the conductor 104 and the second wire 206 in the normal direction of the substrate 100 (e.g., the Z direction in the drawing).

Similarly, when static electric charges overly accumulated in the first wire 202, the electrostatic discharge may occur, and static electric charges may discharge from the first wire 202 to the semiconductor element 102 (102-4). In addition, static electric charges may discharge from the first wire 202 to the second wire 206. In accordance with some embodiments, the breakdown voltage between the first wire 202 and the second wire 206 (i.e. the voltage that is required to penetrate through the insulating layer 406) may be in a range from 400V to 450V, but it is not limited thereto. Moreover, when static electric charges overly accumulated in the semiconductor element 102 (102-4), the electrostatic discharge may occur, and static electric charges may discharge from the semiconductor element 102 (102-4) to the conductor 104, or to the second wire 206. In accordance with some embodiments, the breakdown voltage between the semiconductor element 102 (102-4) and the second wire 206 (i.e. the voltage that is required to penetrate through the insulating layer 404 and the insulating layer 406) may be in a range from 495V to 515V, but it is not limited thereto.

As described above, both the conductor 104 and the second wire 206 may provide additional electrostatic discharge pathways for the electronic device, and therefore the electronic device may be protected from the damage due to electrostatic discharge.

Next, refer to FIG. 9A and FIG. 9B. FIG. 9A and FIG. 9B are respectively a bottom-view diagram and a top-view diagram of a portion of an electronic device in accordance with some other embodiments of the present disclosure.

As shown in FIG. 9A and FIG. 9B, in accordance with some embodiments, the first end portion EA and/or the second portion EB of the semiconductor element 102 may include a protruding portion PP. The protruding portion PP may extend along the direction that is substantially parallel to the extending direction of the first wire 202 (e.g., the X direction in the drawing). In accordance with some embodiments, the protruding portion PP of the first end portion EA and the protruding portion PP of the second end portion EB may face toward different directions. For example, the protruding portion PP of the first end portion EA and the protruding portion PP of the second end portion EB may face toward opposite directions.

Figure 9C:
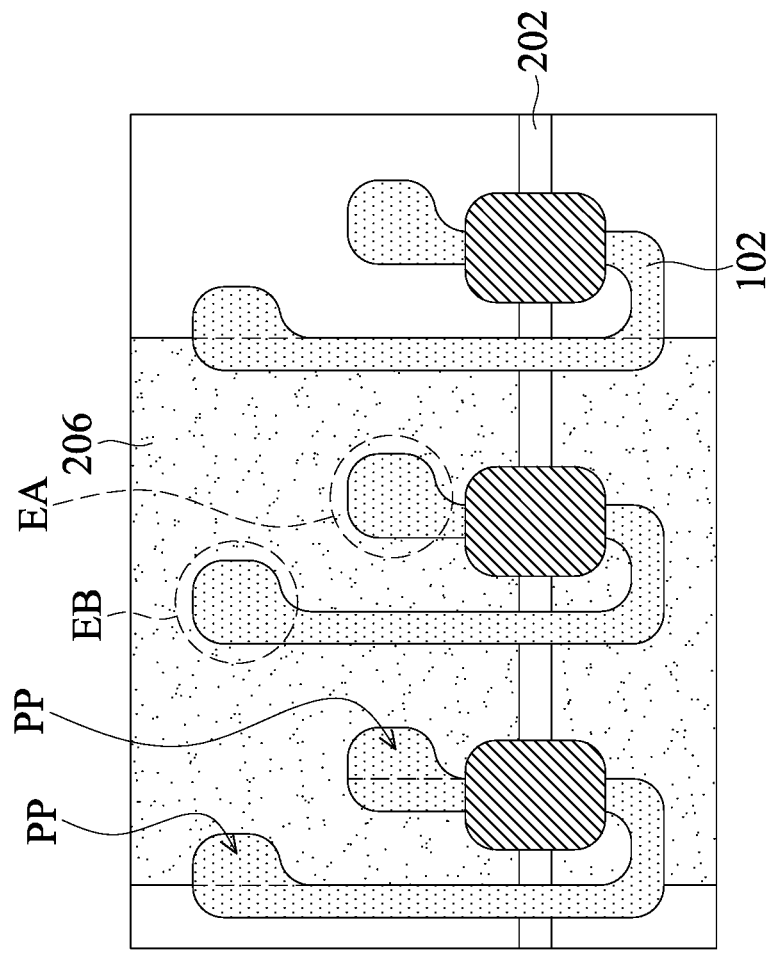
FIG. 9C is a bottom-view diagram of a portion of an electronic device in accordance with some embodiments of the present disclosure.

Next, refer to FIG. 9C, which is a bottom-view diagram of a portion of an electronic device in accordance with some other embodiments of the present disclosure. As shown in FIG. 9C, in accordance with some embodiments, the protruding portion PP of the first end portion EA and the protruding portion PP of the second end portion EB may face toward the same direction.

Figure 10A:
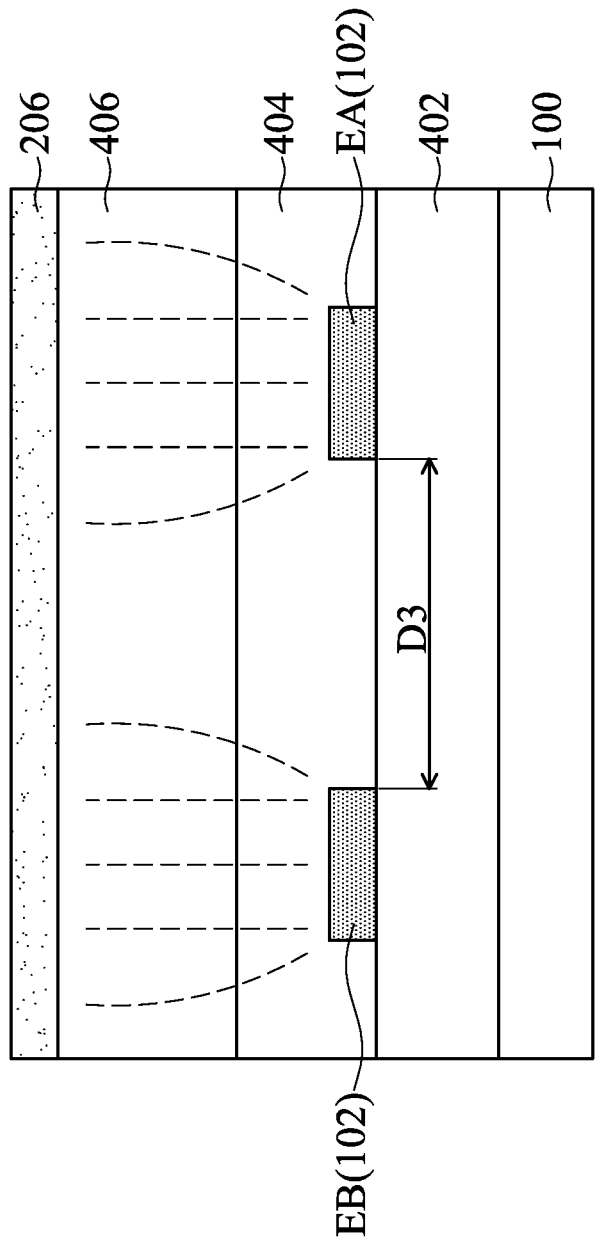
FIG. 10A is a diagram showing lines of electric force between elements of an electronic device in accordance with some embodiments of the present disclosure.
Figure 10B:
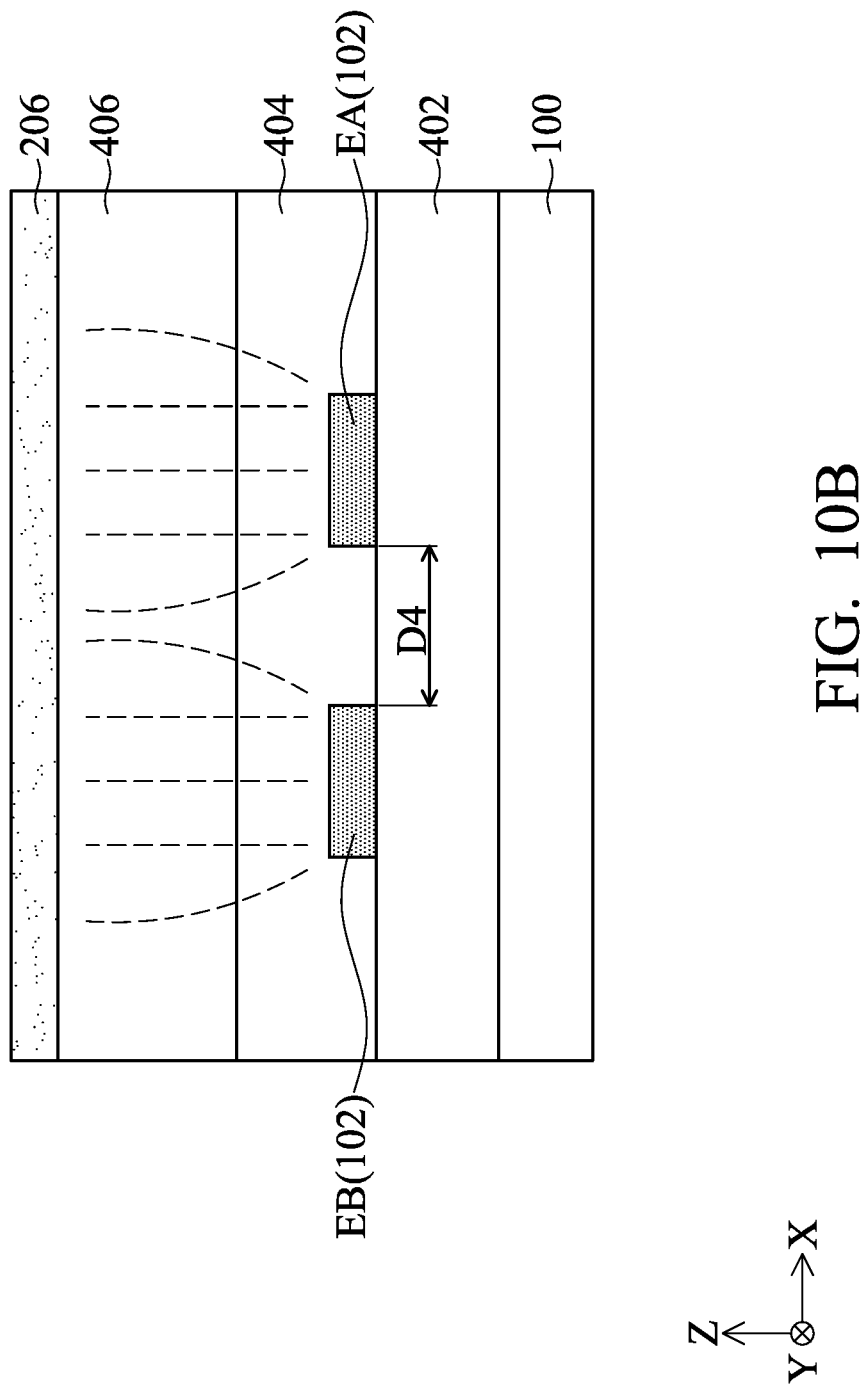
FIG. 10B is a diagram showing lines of electric force between elements of an electronic device in accordance with some embodiments of the present disclosure.

Next, refer to FIG. 10A and FIG. 10B, which are diagrams showing lines of electric force between elements of an electronic device in accordance with some other embodiments of the present disclosure. FIG. 10A and FIG. 10B are shown to further describe why the electrostatic discharge is more likely to occur between the first end portion EA and the second end portion EB of the semiconductor element 102 in the peripheral region PR than between the first end portion EA and the second end portion EB of the semiconductor element 102 in the display region DR.

Referring to FIG. 10A and FIG. 10B, and also referring to FIG. 4, in accordance with some embodiments, the second wire 206 and the semiconductor elements 102 may be spaced apart by the insulating layer 404 and the insulating layer 406. The lines of electric force (indicated as dashed lines) are generated between the second wire 206 and the semiconductor element 102. Since the distance D3 between the first end portion EA and the second end portion EB of the semiconductor element 102 in display region DR (as shown in FIG. 10A) is greater than the distance D4 between the first end portion EA and the second end portion EB of the semiconductor element 102 in the peripheral region PR (as shown in FIG. 10B), the density of the lines of electric force per unit area near the first end portion EA and the second end portion EB in the display region DR is less than that near the first end portion EA and the second end portion EB in the peripheral region PR. Accordingly, static electric charges accumulate more easily in the end portions of the semiconductor element 102 in the peripheral region PR than the end portions of the semiconductor element 102 in the display region DR.

To summarize, in accordance with some embodiments, the provided electronic device has a structural design that renders the electrostatic discharge more likely to occur at the semiconductor element in the peripheral region than in the display region. The protection effect for electrostatic discharge of the electronic device may be improved.

Although some embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The features of the various embodiments can be used in any combination as long as they do not depart from the spirit and scope of the present disclosure. The scope of protection of present disclosure is subject to the definition of the scope of the appended claims.

What is claimed is:

1. An electronic device, comprising:
    a substrate;
    a first wire disposed on the substrate;
    a second wire disposed on the substrate;
    a third wire disposed on the substrate and adjacent to the second wire, wherein the second wire and the third wire cross the first wire, and a width of the third wire is less than a width of the second wire;

a first semiconductor element overlapped with the first wire and the third wire;
a second semiconductor element overlapped with the first wire and adjacent to the first semiconductor element; and
a conductor disposed below the second semiconductor element,
wherein the first semiconductor element and the second semiconductor element each crosses the first wire in two parts and the two parts of the second semiconductor element is less than the two parts of the first semiconductor element in distance,
wherein the conductor is overlapped with at least one of the two parts of the second semiconductor element,
wherein the second wire is at least partially overlapped with the second semiconductor element.

2. The electronic device as claimed in claim 1, wherein the two parts of the second semiconductor element is less than half of the two parts of the first semiconductor element in distance.

3. The electronic device as claimed in claim 1, wherein a ratio of a distance between the two parts of the second semiconductor element to a distance between the two parts of the first semiconductor element is greater than or equal to 0.2 and less than or equal to 0.7.

4. The electronic device as claimed in claim 1, wherein the conductor is at least partially overlapped with the first wire.

5. The electronic device as claimed in claim 1, wherein a width of the second semiconductor element that is overlapped with the conductor and the first wire is less than a width of the second semiconductor element that is overlapped with the conductor but not the first wire.

6. The electronic device as claimed in claim 1, wherein each of the first semiconductor element and the second semiconductor element has a first end portion and a second end portion, and the first end portion is smaller than the second end portion in size.

7. The electronic device as claimed in claim 6, wherein the first end portion of the second semiconductor element is less than the first end portion of the first semiconductor element in radius of curvature.

8. The electronic device as claimed in claim 1, wherein the third wire is electrically connected to the first semiconductor element.

9. The electronic device as claimed in claim 1, wherein the second semiconductor element comprises polysilicon.

10. The electronic device as claimed in claim 1, wherein the first wire is a scan line.

11. The electronic device as claimed in claim 1, wherein the second wire is a common line.

12. The electronic device as claimed in claim 1, wherein the third wire is a data line.

13. The electronic device as claimed in claim 1, which is a display device.

14. An electronic device, comprising:
a substrate;
a first wire disposed on the substrate;
a second wire disposed on the substrate;
a third wire disposed on the substrate and adjacent to the second wire, wherein the second wire and the third wire cross the first wire, and a width of the third wire is less than a width of the second wire;
a first semiconductor element overlapped with the first wire and the third wire; a second semiconductor element overlapped with the first wire and adjacent to the first semiconductor element; and
a third semiconductor element overlapped with the first wire, wherein the second semiconductor element is disposed between the first semiconductor element and the third semiconductor element,
wherein the first semiconductor element and the second semiconductor element each crosses the first wire in two parts and the two parts of the second semiconductor element is less than the two parts of the first semiconductor element in distance,
wherein the second wire is at least partially overlapped with the second semiconductor element.

15. The electronic device as claimed in claim 14, wherein the second wire is overlapped with the third semiconductor element.

16. An electronic device, comprising:
a substrate;
a first wire disposed on the substrate;
a second wire disposed on the substrate;
a third wire disposed on the substrate and adjacent to the second wire, wherein the second wire and the third wire cross the first wire, and a width of the third wire is less than a width of the second wire;
a first semiconductor element overlapped with the first wire and the third wire; and
a second semiconductor element overlapped with the first wire and adjacent to the first semiconductor element;
wherein the first semiconductor element and the second semiconductor element each crosses the first wire in two parts and the two parts of the second semiconductor element is less than the two parts of the first semiconductor element in distance,
wherein each of the first semiconductor element and the second semiconductor element has a first end portion and a second end portion, and the first end portion is smaller than the second end portion in size,
wherein a distance between the first end portion and the second end portion of the second semiconductor element is less than a distance between the first end portion and the second end portion of the first semiconductor element.

17. The electronic device as claimed in claim 16, wherein a ratio of the distance between the first end portion and the second end portion of the second semiconductor element to the distance between the first end portion and the second end portion of the first semiconductor element is greater than or equal to 0.4 and less than or equal to 1.

* * * * *